US007075917B2

(12) United States Patent
Herrmann

(10) Patent No.: US 7,075,917 B2
(45) Date of Patent: Jul. 11, 2006

(54) WIRELESS NETWORK WITH A DATA EXCHANGE ACCORDING TO THE ARQ METHOD

(75) Inventor: Christoph Herrmann, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 984 days.

(21) Appl. No.: 09/973,312

(22) Filed: Oct. 9, 2001

(65) Prior Publication Data

US 2002/0075867 A1    Jun. 20, 2002

(30) Foreign Application Priority Data

Oct. 11, 2000   (DE)   ............... 100 50 117

(51) Int. Cl.
*H04L 12/28*   (2006.01)
*H04L 12/56*   (2006.01)
*H04L 1/18*    (2006.01)

(52) U.S. Cl. .................. 370/349; 370/394; 370/471
(58) Field of Classification Search ................ 370/349, 370/394, 471, 474
See application file for complete search history.

(56) References Cited

U.S. PATENT DOCUMENTS

| 2001/0036169 | A1* | 11/2001 | Ratzel ........................ 370/338 |
| 2003/0157927 | A1* | 8/2003  | Yi et al. ..................... 455/411 |
| 2004/0246917 | A1* | 12/2004 | Cheng et al. ............... 370/328 |

OTHER PUBLICATIONS

By Balachandran K. et al: Entitled: "GPRS-136: High-Rate Packet Data Service for North American TDMA Digital Cellular Systems" IEEE Personal Communications Society, US Bd. 6, Jun. 3, 1999, pp. 34-47.
By Lockitt J.A. et al. "A Selective Repeat ARQ Systems" Proceedings of the International Conference on Digital Satellite Communications. Kyoto, Japan, Nov. 11-13, 1975, pp. 189-195.
By Sophia Antipolis, $3^{RD}$ Generation Partnership Project; Entitled: Technical Specification Group Radio Access Network; Report on Hybrid ARQ Type II/III (Release 2000), 3G TR 25.835 Vo.O.2, TSG-RAN Working Group 2 (Radio L2 and Radio L3, France, Aug. 15-21, 2000.

* cited by examiner

*Primary Examiner*—Melvin Marcelo

(57) ABSTRACT

The invention relates to a wireless network comprising a radio network controller and a plurality of assigned terminals, which are provided for exchanging data according to the hybrid ARQ method of type II or III and each form a receiving and/or transmitting side. A physical layer of a transmitting side is arranged for
  storing coded transport blocks in a memory, which blocks contain at least a packet data unit delivered by the assigned radio link control layer and can be identified by a packet data unit sequence number,
  storing abbreviated sequence numbers whose length depends on the maximum number of coded transport blocks to be stored and which can be shown unambiguously shown in a packet data unit sequence number, and for
  transmitting coded transport blocks having at least the assigned abbreviated sequence numbers.
a physical layer of a receiving side is provided for testing the correct reception of the coded transport block and for sending a positive acknowledge command to the transmitting side over a back channel when there is correct reception and a negative acknowledge command when there is error-affected reception.

10 Claims, 3 Drawing Sheets

WIRELESS NETWORK WITH A DATA EXCHANGE ACCORDING TO THE ARQ METHOD

Figure 1:
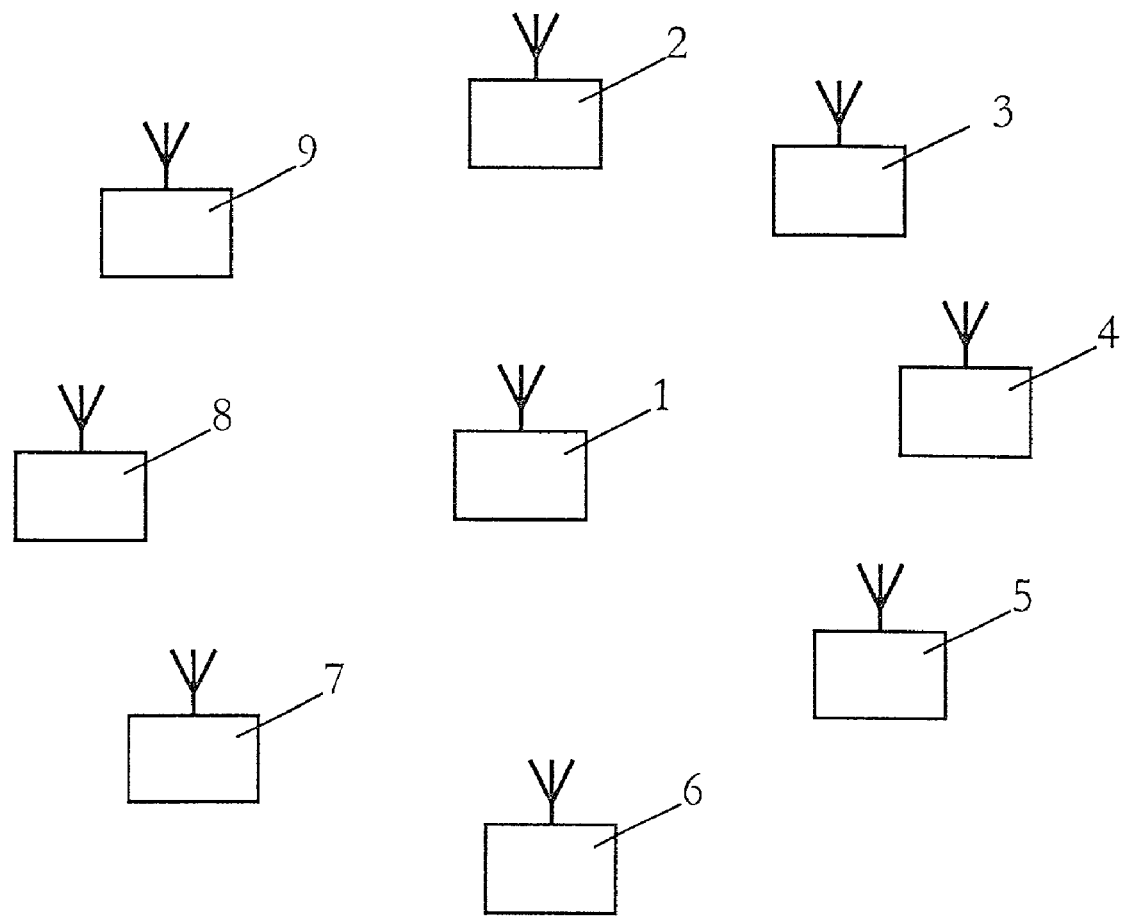

The invention relates to a wireless network comprising a radio network controller and a plurality of assigned terminals, which are each provided for exchanging data and which form a receiving and/or transmitting side.

Such a wireless network is known from the document "3$^{rd}$ Generation Partnership Project; Technical Specification Group Radio Access Network; Report on Hybrid ARQ Type II/III (Release 2000), 3G TR 25.835 V0.0.2, TSG-RAN Working Group 2 (Radio L2 and Radio L3), Sophia Antipolis, France, 21–15 August 2000". For the secured transmission of data a method is used here which is called the hybrid ARQ-method type II or III (ARQ=Automatic Repeat Request). The data sent in Packet Data Units (PDU) by the Radio Link Control layer (RLC layer) are additionally provided for the error correcting coding with an error control through repetition of transmission. This means that in the case of an error-affected reception of a packet data unit packed in a transport block coded by one of the assigned physical layers, the received packet data unit affected by error is sent anew. With the hybrid ARQ method type I the received packet data unit affected by error is rejected and an identical copy is requested anew. With the hybrid ARQ methods types II and III the received packet data unit affected by error is buffered and, after additional incremental redundancy relating to the received packet data unit, decoded together with the received packet data unit affected by error. Since only incremental redundancy and not the whole error-affected packet data unit is transmitted anew, the amount of data to be transmitted anew is reduced. With the ARQ method type II the incremental redundancy is useless without the buffered (error-affected) packet, with the ARQ method type III the incremental redundancy can be decoded also without the buffered (error-affected) packet. The coded transport blocks are sent over at least one transport channel. A message about the error-free reception in said document is sent only when the receiving RLC layer establishes on the basis of the so-called RLC sequence number that packet data units are lacking, even if the physical layer has already recognized the packet data unit as being error-affected. This means that the packet data unit is to be buffered over long time spaces until an incremental redundancy is requested and then, after a successful decoding, the reception may be acknowledged as correct, especially when the receiving side is the network side, while the physical layer and the RLC layer are usually located on different hardware components. In addition to the packet data units contained in the transport blocks, the RLC sequence numbers of the packet data unit and a redundancy version are to be transmitted in synchronism with the coded transport block when the hybrid ARQ methods of type II or III are implemented. This transmission is generally effected over a clearly better protected transport channel to safeguard that this information is error-free already at first reception. The information is decisive if after a repetition of transmission with incremental redundancy the buffered (error-affected) packet data unit is decoded together with the incremental redundancy, because the incremental redundancy is to be assigned to the respective packet data unit via the redundancy version.

It is an object of the invention to provide a wireless network in which error-affected data repeatedly to be transmitted according to the ARQ method of the type II or III are buffered for a shorter period of time on average.

The object is achieved by the following features by the wireless network mentioned in the opening paragraph which comprises a radio network controller and a plurality of assigned terminals which are each provided for exchanging data and which form each a receiving and/or transmitting side:

A physical layer of a transmitting side is provided for
  storing coded transport blocks in a memory, which blocks contain at least a packet data unit which is delivered by the assigned radio link control layer and can be identified by a packet data unit sequence number,
  storing abbreviated sequence numbers whose length depends on the maximum number of coded transport blocks to be stored and which can be shown unambiguously in a packet data unit sequence number, and for
transmitting coded transport blocks having at least the assigned abbreviated sequence number and
a physical layer of a receiving side is provided for testing the correct reception of the coded transport block and for sending a positive acknowledge command to the transmitting side over a back channel when there is correct reception and a negative acknowledge command when there is error-affected reception.

The wireless network according to the invention may be, for example, a radio network according to the UMTS standard (UMTS=Universal Mobile Telecommunication System). With this system, when, for example, data are transmitted according to the ARQ method of type II or III, the transmission of an acknowledge command over a back channel unknown thus far between a physical layer of a transmitting side (for example, a radio network controller) and the physical layer of a receiving side (for example, a terminal) provides that a correct or error-affected transmission of a transport block is announced to the transmitting side much more rapidly than known until now. As a result, a repetition of transmission with incremental redundancy may be effected rapidly. This enables the receiving side to buffer the received coded transport block affected by error clearly more briefly, because the additional redundancy necessary for the correct decoding is available at an earlier instant. In this manner, the memory capacity or memory area needed on average for buffering received coded transport blocks affected by error is also reduced.

The use of abbreviated sequence numbers reduces the extent of information that is required to be additionally transmitted for managing the transport blocks and packet data units and simplifies the assignment of the received acknowledge command to the stored transport blocks. The physical layer of a receiving side is provided here for sending a positive or negative acknowledge command with the abbreviated sequence number of the correctly or received transport block affected by error over the return channel.

In lieu of transmitting the abbreviated sequence number, an abbreviated sequence number of a transport block which a received acknowledge command relates to can also implicitly be determined based on the length of time between the transmission of the transport block and the reception of the acknowledge command and on the transmission sequence of the acknowledge command in case of a plurality of received acknowledge commands. This is made possible in a simple manner in that a transmission of the transport blocks is provided in radio frames and in that the transmission of an acknowledge command from the transmitting side to the receiving side is provided in the F$^{th}$ radio frame at the earliest after the radio frame that contains the respective transport block (with F≧1). The order of a plurality of acknowledge commands corresponds to the order of the transmission of transport blocks in a preceding radio frame.

If the physical layer of a transmitting side has received a negative acknowledge command, the physical layer once again requests the radio link control layer to transmit the packet data unit that has been transmitted affected by error via the coded transport block. After a packet data unit has been received, the physical layer forms therefrom a coded transport block which contains an incremental redundancy.

The invention also relates to a radio network controller and a terminal in a wireless network which exchange data according to the hybrid ARQ method.

These and other aspects of the invention are apparent from and will be elucidated with reference to the embodiments described hereinafter.

Figure 2:
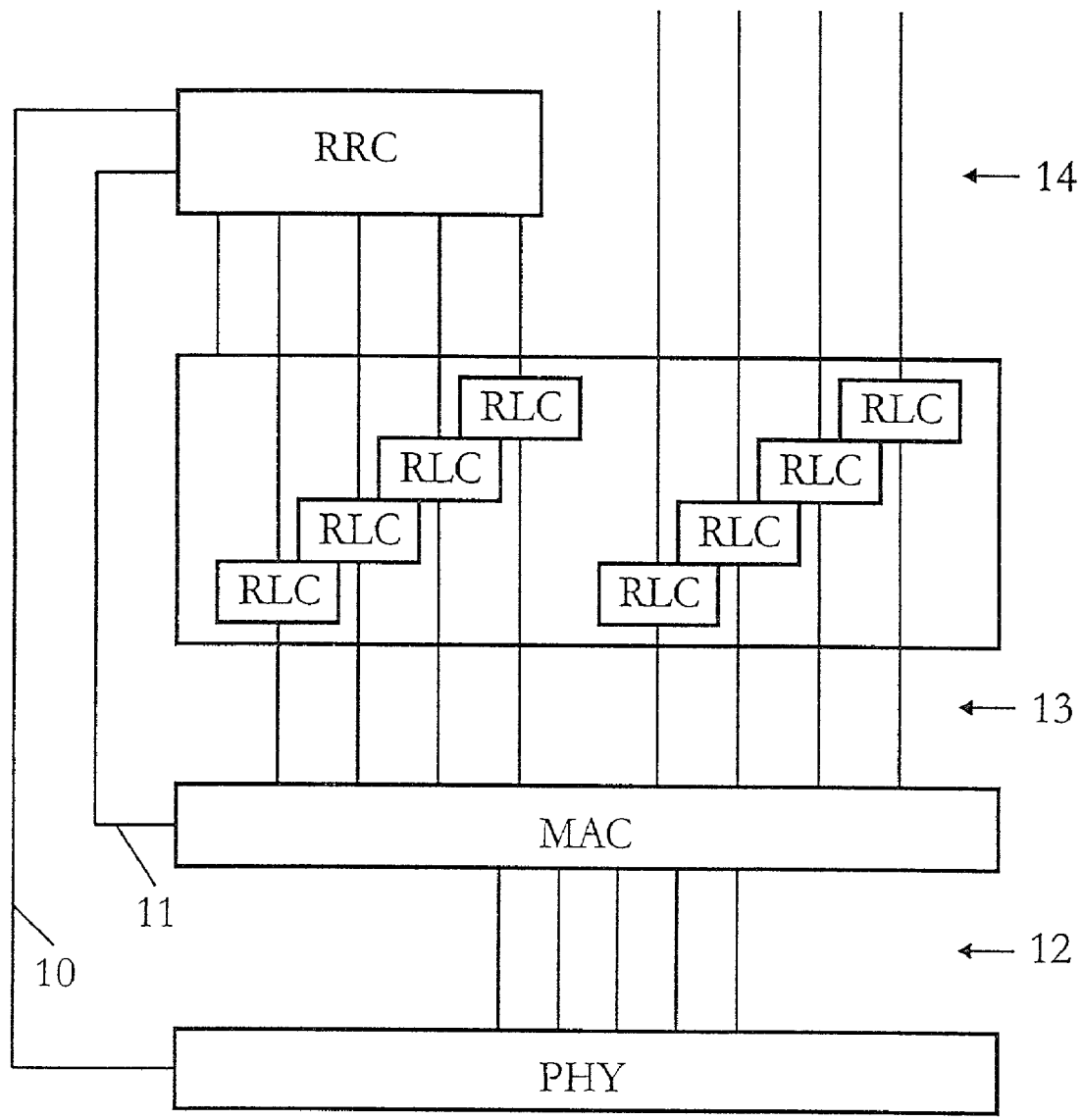
Figure 3:
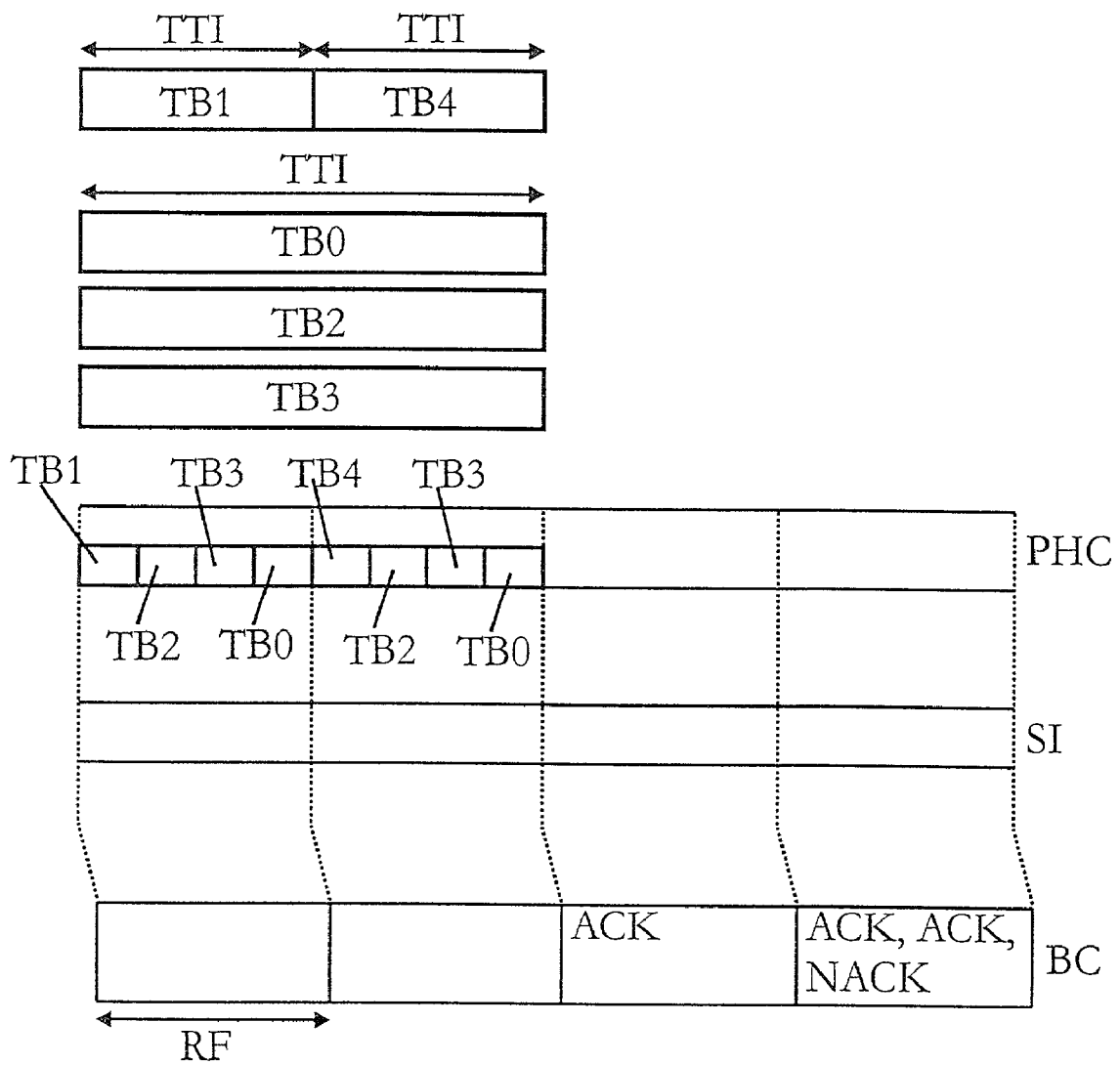

In the drawings:

FIG. 1 shows a wireless network comprising a radio network controller and a plurality of terminals, FIG. 2 shows a layer model for explaining different functions of a terminal or of a radio network controller and FIG. 3 shows a plurality of radio frames which contain data to be transmitted over the radio path between radio network controller and terminals.

FIG. 1 shows a wireless network, for example, radio network, including a radio network controller (RNC) 1 and a plurality of terminals 2 to 9. The radio network controller 1 is responsible for controlling all the components taking part in the radio traffic such as, for example, the terminals 2 to 9. An exchange of control and useful data takes place at least between the radio network controller 1 and the terminals 2 to 9. The radio network controller 1 sets up a respective link for the transmission of useful data.

As a rule, the terminals 2 to 9 are mobile stations and the radio network controller 1 is fixedly installed. A radio network controller 1 may, however, also be movable or mobile, as appropriate.

In the wireless network are transmitted, for example, radio signals in accordance with the FDMA, TDMA or CDMA method (FDMA=frequency division multiple access, TDMA=time division multiple access, CDMA=code division multiple access), or in accordance with a combination of the methods.

In the CDMA method, which is a special code-spreading method, binary information (a data signal) coming from a user is modulated with a respective code sequence. Such a code sequence includes a pseudo-random square-wave signal (pseudo-noise code), whose rate, also called chip rate, is generally considerably higher than that of the binary data. The length of time of a square-wave pulse of the pseudo-random square-wave signal is referred to as a chip interval $T_C$. $1/T_C$ is the chip rate. The multiplication or modulation respectively, of the data signal by the pseudo-random square-wave signal has a spreading of the spectrum by the spreading factor $N_C=T/T_C$ as a result, where T is the length of time of the square-wave pulse of the data signal.

Useful data and control data are transmitted between at least one terminal (2 to 9) and the radio network controller 1 over channels predefined by the radio network controller 1. A channel is determined by a frequency range, a time range and, for example, in the CDMA method, by a spreading code. The radio link from the radio network controller 1 to the terminals 2 to 9 is referred to as the downlink and from the terminals to the base station as the uplink. Thus data are sent over downlink channels from the base station to the terminals and over uplink channels from the terminals to the base station.

For example, a downlink control channel may be provided which is used for broadcasting, prior to a connection setup, control data coming from the radio network controller 1 to all the terminals 2 to 9. Such a channel is referred to as downlink broadcast control channel. For transmitting control data from a terminal 2 to 9 to the radio network controller 1 prior to a connection setup, for example, an uplink control channel assigned by the radio network controller 1 can be used which, however, may also be accessed by other terminals 2 to 9. An uplink channel that can be used by various terminals or all the terminals 2 to 9 is referred to as a common uplink channel. After a connection setup, for example, between a terminal 2 to 9 and the radio network controller 1, useful data are transmitted by a downlink and an uplink user channel. Channels that are set up between only one transmitter and one receiver are referred to as dedicated channels. As a rule, a user channel is a dedicated channel which may be accompanied by a dedicated control channel for transmitting link-specific control data.

For exchanging useful data between the radio network controller 1 and a terminal, it is necessary for a terminal 2 to 9 to be synchronized with the radio network controller 1. For example, it is known from the GSM system (GSM=Global System for Mobile communication), in which a combination of FDMA and TDMA methods is used, that after a suitable frequency range is determined based on predefined parameters, the position in time of a frame is determined (frame synchronization), with the aid of which frame the order in time for transmitting data is determined. Such a frame is always necessary for the data synchronization of terminals and base station in TDMA, FDMA and CDMA methods. Such a frame may contain several subframes, or together with various other successive frames, form a superframe.

The exchange of control and useful data via the radio interface between the radio network controller 1 and the terminals 2 to 9 can be explained with the layer model or protocol architecture shown by way of example in FIG. 2 (compare for example $3^{rd}$ Generation Partnership Project (3GPP); Technical Specification Group (TSG) RAN; Working Group 2 (WG2); Radio Interface Protocol Architecture; TS 25.301 V3.2.0 (1999-10)). The layer model comprises three protocol layers: the physical layer PHY, the data link layer having the sub-layers MAC and RLC (in FIG. 2 various objects of the sub-layer RLC are shown) and the layer RRC. The sub-layer MAC is equipped for Medium Access Control, the sub-layer RLC for Radio Link Control and the layer RRC for Radio Resource Control. The layer RRC is responsible for the signaling between the terminals 2 to 9 and the radio network controller 1. The sub-layer RLC is used for controlling a radio link between a terminal 2 to 9 and a radio network controller 1. The layer RRC controls the layers MAC and PHY via control links 10 and 11. By doing this, the layer RRC can control the configuration of the layers MAC and PHY. The physical layer PHY offers transport links 12 to the layer MAC. The layer MAC renders logic connections 13 available to the layer RLC. The layer RLC can be reached by applications via access points 4.

In such a network a method of securely transmitting data is used, which is called the hybrid ARQ (ARQ=Automatic Repeat Request) method. The data sent in packet data units PDU are additionally provided for a forward error correction by means of an error control via repetitions of transmissions. This means that in case a packet data unit is received affected by error, the received packet data unit affected by error is sent anew. With the hybrid ARQ methods of type II or III it is possible to send only certain parts of the data of an error-affected transmission once again. This is referred to as incremental redundancy.

The packet data units are formed in the RLC layer and packed to transport blocks in the MAC layer, which transport blocks are transmitted by the physical layer from the radio network controller to a terminal or vice versa over the available transport channels. In the physical layer the transport blocks are provided with a cyclic redundancy check (CRC) and coded together. The result of this operation is referred to as a coded transport block. The coded transport blocks contain a packet data unit and control information.

Coded transport blocks affected by error that were transmitted are buffered in the physical layer of the receiving side for the conversion according to the hybrid ARQ method of type II or III until the incremental redundancy required afterwards makes an error-free decoding possible. It is known that at least the RLC sequence number or packet data unit sequence number, which features a packet data unit, and a redundancy version is to be transmitted, in parallel with the coded transport block or the incremental redundancy required afterwards, as so-called side information (compare: "3$^{rd}$ Generation Partnership Project; Technical Specification Group Radio Access Network; Report on Hybrid ARQ Type II/III (Release 2000), 3G TR 25.835 V0.0.2, TSG-RAN Working Group 2 (Radio L2 and Radio L3), Sophia Antipolis, France, 21–15 August 2000"), so that the receiving side can detect which coded transport block is concerned or which buffered coded transport block the additionally transmitted redundancy refers to when a coded transport block affected by error or additional incremental redundancy affected by error is received. The redundancy version indicates whether it is a first-time sent incremental redundancy or which next incremental redundancy possibly repeated several times is concerned.

According to the invention, an abbreviated sequence number in lieu of the RLC sequence number is used for the transmission of the side information over the radio interface, the length of which abbreviated sequence number is clearly shorter than the RLC sequence number. This abbreviated sequence number is determined by the number of M coded transport blocks which, on the receiving side, can at most be buffered simultaneously, and consists of ⌈1d M⌉ bits. (⌈1d M⌉ means the logarithm to the base of 2 rounded to the next higher natural number).

For this purpose, the transmitting physical layer generates an abbreviated sequence number from the RLC sequence number locally received as side information from the RLC layer. The physical layer contains another table or a memory which stores the abbreviated sequence number and the RLC sequence number, so that an image of the RLC sequence number follows the abbreviated sequence number. If the physical layer receives from the RLC layer a transport block containing side information, but all the abbreviated sequence numbers have already been issued, this transport block cannot be transmitted and the RLC layer is to be informed of this queue situation. In another case the physical layer selects a non-issued abbreviated sequence number, writes the relation to the RLC sequence number in the table and codes the transport block and sends it as a coded transport block with the side information via the radio interface. For an incremental redundancy to be sent afterwards, which relates to this coded transport block, again this abbreviated sequence number is taken from the table and sent in the side information in parallel with the incremental redundancy.

To inform the transmitting side (transmitting terminal or radio network controller) of the fact that a transport block has not been transmitted error-free, according to the invention a fast back channel is provided which is inserted directly between the receiving physical layer and the sending physical layer and not between the RLC layers concerned. The back channel is built up if a terminal and the radio network controller have agreed that data are transmitted according to the hybrid ARQ method of type II or III. The receiving physical layer checks whether the coded transport block has been transmitted correctly. If it has, a positive acknowledge signal ACK is sent to the sending physical layer over the back channel. Conversely, if the coded transport block has not been received error-free, a negative acknowledge command NACK is sent to the sending physical layer.

The positive and negative acknowledge commands ACK and NACK may each contain the abbreviated sequence number of the correctly or erroneously received coded transport block. The sending side can also identify the transmitted transport block affected by error on account of the number of a radio frame, which contains the positive or negative acknowledge command. The acknowledge commands in a radio frame of the back channel relate to coded transport blocks which were transmitted in transmission time intervals TTI which ended in a radio frame that preceded by exactly F radio frames (with F≧1) the radio frame containing the acknowledge commands. FIG. 3 shows this. A transport time interval TTI indicates the time which a transport block lasts and corresponds at least to the length of time of one radio frame RF which determines the time necessary for the transport blocks to be sent over the radio link or radio interface. The numbers of the radio frames are generally broadcast to the mobile stations via a broadcast channel. In FIG. 3 are shown various transport blocks TB0 to TB4 which are to be transmitted for the length of time of two radio frames RF. The transport block TB0 in this example is not transmitted according to the hybrid ARQ method of type II or III, whereas the other transport blocks are to be transmitted indeed according to the hybrid ARQ methods of type II or III. The announcement about a correct or error-affected transmission thus only occurs for the transport blocks TB1 to TB4 via a positive or negative acknowledge command over the physical back channel.

The transmission time interval TTI of the transport blocks TB1 and TB4 is equal to the length of time of a single radio frame RF and the transmission time interval TTI of the transport blocks TB0, TB2 and TB3 is equal to two radio frames RF. A first part of the transport blocks TB2, TB3 and TB0 and transport block TB1 are used for transmitting coded transport blocks during a first radio frame RF and a second part of the transport blocks TB2, TB3 and TB0 and transport block TB4 during a second subsequent radio frame RF over the physical channel PHC. It is assumed that the transport blocks TB1, TB2 and TB4 have been received correctly and the transport block TB3 from a terminal or from the network controller. The correct or error-affected reception is checked in a radio frame RF which comes after the ended Transmission Time Interval (TTI) and is announced to the sending side (F=2) in the next radio frame RF via the back channel BC. FIG. 3 shows in the third radio frame RF the positive acknowledge command ACK for the transport block TB1 and in the fourth radio frame RF the positive acknowledge command ACK for the transport blocks TB4 and TB2 and the negative acknowledge command NACK for the transport block TB3. No acknowledge command is sent for the transport block TB0, because this command is not transmitted according to an ARQ method of type II or III. The acknowledge commands are sorted in the sequence in which the transport blocks have been sent. The acknowledge command can, however, also be sent during a later radio frame RF. The number F of radio frames RF which occur between the reception of a transport block (i.e. after the transmission time interval has ended) or a number of transport blocks (i.e. after their transmission time intervals have ended, ending all at the same frame boundary) and the sending of an acknowledge command should be selected so that the receiving side has enough time to decode all co-transmitted transport blocks and check them for errors.

The transmission of the transport blocks TB0 to TB4 is accompanied with data called side information, which contain at least information about the redundancy version and about the abbreviated sequence number of a transport block. This side information is referred to as SI in FIG. 3.

If a sending side receives a negative acknowledge command NACK, additional incremental redundancy is prompted to be sent. The physical layer that has received the negative acknowledge command (NACK) for one or more received coded transport blocks affected by errors, determines the RLC sequence number of the packet data unit which the negative acknowledge commands relate to and announces to the associated RLC layer the RLC sequence numbers of the error-affected packet data units. At the same time, the receiving physical layer stores the RLC sequence numbers of the packet data units that have been announced to be error-affected. The RLC layer then sends each one of these packet data units again, as in the case where the opposite RLC layer requests to send a packet data unit again (hybrid ARQ method type I). The MAC layer generates a transport block from the packet data unit, which transport block is then transferred with the side information to the physical layer. The physical layer compares the RLC sequence number contained in the side information with the buffered sequence number and recognizes that this transport block is to be sent as a repetition of transmission. The physical layer generates a coded transport block which contains the necessary incremental redundancy and no longer the whole coded packet data unit—as defined by the hybrid ARQ method type II or III.

If the physical layer has received a positive acknowledge command ACK, it deletes the stored RLC sequence number. Via this RLC sequence number the physical layer can also acknowledge the correct reception of the packet data unit to the associated RLC layer, which RLC layer then deletes the packet data unit that has this RLC sequence number from its buffer. This is particularly possible in the case of the downlink direction, when physical layer and RLC layer are not accommodated on separate hardware components in the receiving mobile station. On the other hand, it may be more favorable for the sending RLC layer to wait for the acknowledgement of receipt from the RLC layer on the receiving side, because it is still possible for transmission errors to occur when the transport block is transferred from the receiving physical layer to the receiving RLC layer (more particularly in the uplink direction, because here the receiving physical layer and the receiving RLC layer are accommodated on different hardware components).

The invention claimed is:

1. A wireless network comprising a radio network controller and a plurality of assigned to signals, which are each provided for exchanging data according to the hybrid ARQ method an which form a receiving and/or transmitting side, in which a physical layer of a transmitting side is arranged for storing coded transport blocks in a memory, which blocks contain at least a packet data unit which is delivered by an assigned radio link control layer and can be identified by a packet data unit sequence number, storing abbreviated sequence numbers whose length depends on the maximum number of coded transport blocks to be stored and which can be shown unambiguously in a packet data unit sequence number, and for transmitting coded transport blocks having at least an assigned abbreviated sequence number and a physical layer of a receiving side is provided for testing the correct reception of the coded transport block and for sending a positive acknowledge command to the transmitting side over a back channel when there is correct reception and a negative acknowledge command when there is error-affected reception.

2. A wireless network as claimed in claim 1, characterized in that the radio network controller and the assigned terminals are provided for exchanging data according to the hybrid ARQ method of type II or III.

3. A wireless network as claimed in claim 1, characterized in that the physical layer of a receiving side is provided for sending a positive or negative acknowledge command with the abbreviate sequence number of the transport block received correctly or affected by error.

4. A wireless network as claimed in claim 1, characterized in tat the physical layer of one of a sending side or transmitting side, after the reception of a positive or negative acknowledge command, is provided for determining the abbreviated sequence number of the respective coded transport block transmitted correctly or affected by error based on the length of time between transmission of the transport block and reception of the acknowledge command and the sending sequence of the acknowledge command when there is a plurality of received acknowledge commands.

5. A wireless network as claimed in claim 3, characterized in that a transmission of the coded transport blocks is provided in radio frames and in that the transmission of an acknowledge command from either the sending side or the transmitting side to the receiving side is provided in a subsequent radio frame after the radio frame in which the transmission of the respective coded transport block ends.

6. A wireless network as claimed in claim 4, characterized in that the order of a plurality of acknowledge commands corresponds to the order of the transmission of last parts of transport blocks in previous radio frame.

7. A wireless network as claimed in claim 1, characterized in that the physical layer of one of a sending side or transmitting side, upon reception of a positive acknowledge command, is provided for deleting the assigned transport block and the abbreviated sequence number and for announcing the correct reception to the radio link control layer.

8. A wireless network as claimed in claim 1, characterized in that the physical layer of one of a sending side or transmitting side, upon reception of a negative acknowledge command, is provided for requesting the radio link control layer to transmit a packet data unit that has been transmitted affected by error via the coded transport block and in that the physical layer, upon reception of a packet data unit repeatedly sent by the radio link control layer is provided for forming a coded transport block which contains an incremental redundancy.

9. A radio network controller in a wireless network comprising a plurality of terminals, which radio network controller is provided for exchanging data with the terminals and which forms a receiving and/or transmitting side, in which a physical layer of the radio network controller arranged as a transmitting side for storing coded transport blocks in a memory, which blocks contain at least a packet data unit which is delivered by an assigned radio link control layer and can be identified by a packet data unit sequence number, storing abbreviated sequence numbers whose length depends on the maximum number of coded transport blocks to be stored and which can be shown unambiguously in a packet data unit a sequence number, and for transmitting coded transport blocks having at least an assigned abbreviated sequence number and a physical layer of the radio network controller is arranged as a receiving side for testing the correct reception of a coded transport block from a terminal and for sending a positive acknowledge command to a terminal over a back channel when there is correct reception and a negative knowledge command when there is error-affected reception.

10. A terminal in a wireless network comprising further terminals and a radio network controller, which terminal is provided for exchanging data with the terminals and which forms a receiving and/or transmitting side, in which a physical layer of the terminal is arranged as a transmitting side for storing coded transport blocks in a memory, which blocks contain at least a packet data unit which is delivered by an assigned radio link control layer and can be identified by a packet data unit sequence number, storing abbreviated sequence numbers whose length depends on the maximum number of coded transport blocks to be stored and which can be shown unambiguously in a packet data unit a sequence number, and for transmitting coded transport blocks to the radio network controller having at least an assigned abbreviated sequence number and A physical layer of the terminal is arranged as a receiving side for testing the correct reception of a coded transport block from the radio network controller and for sending a positive acknowledge command to the radio network controller over a back channel when there is correct reception and a negative acknowledge command when there is error-affected reception.

* * * * *